United States Patent
Yamada

(10) Patent No.: US 7,603,636 B2
(45) Date of Patent: Oct. 13, 2009

(54) ASSERTION GENERATING SYSTEM, PROGRAM THEREOF, CIRCUIT VERIFYING SYSTEM, AND ASSERTION GENERATING METHOD

(75) Inventor: Takamitsu Yamada, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 365 days.

(21) Appl. No.: 10/579,766

(22) PCT Filed: Sep. 21, 2005

(86) PCT No.: PCT/JP2005/017921

§ 371 (c)(1),
(2), (4) Date: May 18, 2006

(87) PCT Pub. No.: WO2006/035854

PCT Pub. Date: Apr. 6, 2006

(65) Prior Publication Data

US 2008/0104556 A1   May 1, 2008

(30) Foreign Application Priority Data

Sep. 30, 2004   (JP) .............................. 2004-286042

(51) Int. Cl.
   *G06F 17/50*   (2006.01)
(52) U.S. Cl. .................. 716/4; 716/5; 716/18
(58) Field of Classification Search ........ 716/4, 716/5, 18
See application file for complete search history.

(56) References Cited

U.S. PATENT DOCUMENTS

| | | | | |
|---|---|---|---|---|
| 6,591,403 | B1 * | 7/2003 | Bass et al. | 716/5 |
| 6,742,166 | B2 * | 5/2004 | Foster et al. | 716/4 |
| 7,076,753 | B2 * | 7/2006 | Cerny et al. | 716/5 |
| 7,174,522 | B2 * | 2/2007 | Busch | 716/5 |
| 7,194,713 | B2 * | 3/2007 | Iwashita | 716/5 |
| 7,313,772 | B2 * | 12/2007 | Hekmatpour et al. | 716/5 |
| 7,325,209 | B2 * | 1/2008 | Mitra et al. | 716/5 |

FOREIGN PATENT DOCUMENTS

JP   7-049887   2/1995

(Continued)

OTHER PUBLICATIONS

Tasiran et al.; "Linking Simulation with Formal Verification at a Higher Level"; Synergies for Design Verification; IEEE Design & Test of Computers; vol. 21, No. 6; Jun. 2004; pp. 472-482.

(Continued)

*Primary Examiner*—Vuthe Siek
(74) *Attorney, Agent, or Firm*—Dickstein Shapiro LLP

(57) ABSTRACT

An assertion generating system is disclosed. In an assertion generating system 207, a graphical editor 201 generates design data of a semiconductor integrated circuit by graphically editing a specification (finite state machine, process sequence) of the semiconductor integrated circuit with the use of a state transition table and a state transition figure or by editing the process sequence into a timing chart and a time series figure based on user operations, and a syntax analyzer 203 and a property extractor 204 generate a property that verifies the specification of the semiconductor integrated circuit based on the design data. The assertion generator 205 converts the property into an assertion description language 206.

14 Claims, 12 Drawing Sheets

FOREIGN PATENT DOCUMENTS

| | | |
|---|---|---|
| JP | 2000-142918 | 5/2000 |
| JP | 2000-181933 | 6/2000 |
| JP | 2004-326650 | 11/2004 |

OTHER PUBLICATIONS

Chen et al.; "Logic of Constraints: A Quantitative Performance and Functional Constraint Formalism"; IEEE Transactions on Computer-Aided Design of Integrated Circuits and Systems; vol. 23, No. 8; Aug. 2004; pp. 1243-1255.

Datta et al.; "Assertion Based Verification Using HDVL"; Proceedings of the 17th International Conference on VLSI Design; Jan. 2004; pp. 319-325.

Pixley et al.; "Functional Verification 2003: Technology, Tools and Methodology"; Proceedings 5th International Conference, IEEE; vol. 1; Oct. 2003; pp. 1-5.

Property Specification Language Reference Manual Version 1.1, Jun. 9, 2004.

TransEDA Announces Industry-First Property 1-15 Capture and Validation Product, [online], Jun. 2, 2003, [retrieved on Oct. 14, 2005], Retrieved from the Internet<URL: http://www.transeda.com/news/view.php?id=54&s year=2003 > & <URL: http://www.transeda.com/news/languages/Japanese_54.doc >.

* cited by examiner

FIG.11

| NAME | FADD | | | |
|---|---|---|---|---|
| CLOCK | posedge clk | | | |
| CONDITION | CONDITION | CONDITION | EXPECT | EXPECT |
| A | B | CI | S | CO |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

FIG.12

```
typedef struct piece {
    struct piece    *left, *right, *top, *bottom
    char*           str;

} Piece ;
```

FIG.15

| NAME | reqack |
|---|---|
| CLOCK | posedge clk |
| CONDITION | EXPECT |
| req | ack |
| rose | 0[*2:5];1;0 |

ASSERTION GENERATING SYSTEM, PROGRAM THEREOF, CIRCUIT VERIFYING SYSTEM, AND ASSERTION GENERATING METHOD

TECHNICAL FIELD

The present invention relates to a technology that executes circuit verification of an LSI (large scale integration) and so on using a process based on a computer program, and a verifying technology for verifying so that design violation and missing verification do not exist in design data by converting a property of a circuit to be verified into an assertion description and inputting the assertion description to a simulator when the design data of a circuit in a RTL (register transfer level) are dynamically verified by the simulator; and in particular, an assertion generating system, a program thereof, a circuit verifying system, and an assertion generating method, in which the above technology is used.

The property to be discussed below is plain text that defines operations intended and expected in design data to be verified. For example, the property defines a relation between reception and response of a request signal and an approval signal in an arbiter circuit on time series constraint, and defines a regular state of the time series constraint and circuit specifications to be forbidden. In addition, the property is an event to be monitored as a function coverage point which confirms whether a specific circuit sequence has been tested by a simulation. Property verification verifies whether a design description satisfies a predetermined property.

BACKGROUND ART

Recently, a system has been revised or a revised edition of a system has been published frequently, caused by missing verification of a corner case due to the complexity of a circuit and an increase of circuit size of a semiconductor integrated circuit, by missing confirmation of interface specifications among blocks allocated to plural designers due to group work, or by specification errors of a reusable core purchased from a third party.

These problems come from, for example, insufficient circuit verification or a test scenario that can extract bugs, which were not able to be formed because a corner case and core specifications of the third party were not understood sufficiently.

In order to solve these problems, an assertion verification technology, in which a property with respect to circuit specifications is converted into an assertion description and the assertion description is input to a simulator (computer) for verification, and a function coverage report for showing a warning for assertion violation during the simulation and showing whether a specific circuit sequence has been tested by a simulator is given, has been proposed and has been recently put into use in actual designing.

An assertion is a note in which intention (in some cases, this shows property) of designing is written and is generally written by a comment sentence in a RTL. The intention is interpreted by a simulator during the verification, for example, an error log is generated in a case where a circuit to be verified operates differently from the intention. The intention of designing is, for example, an assumption and a precondition of circuit input, and in addition to these, expected operations when the conditions are satisfied.

The simulator checks the following two matters.

(1) Specific events such as an assumption and a precondition have occurred.

(2) Expected operations at that time complete normally.

From the above check (1), the assertion gives feedback of determining information as to whether a specific circuit function is confirmed by verification. Therefore, when the assertion is comprehensively installed in a circuit to be verified, function coverage of the assertion can be obtained; consequently, its verification accuracy can be obtained quantitatively.

From the above check (2), the feedback to a verification debugging can be obtained by the assertion. For example, an assertion installed in a position, from which an influence caused by a circuit malfunction cannot be observed by external terminals, complements a malfunction state. In addition, when conditions such as an assumption and a precondition are satisfied in any stimulus, this expected operation is checked at any time. Therefore, for example, even when the stimulus is structured by a random system, self-collation with the expected operation, that is, comparison of expected values, can be executed. In addition, an assertion installed in a lower block is also effective in chip level verification.

The intention of designing may be described by a Verilog-HDL for verification being different from a RTL for logic synthesis; however, here, another assertion language is described.

At present, the most popular assertion language is a PSL (property specification language) described in Non-Patent Document 1. The PSL is an assertion language which will be given to IEEE from a standardization organization named Accellera, and is actually a standard language. In the following, an actual example of an assertion description using the PSL is shown.

For example, it is assumed that the following design intention (property) for memory control is desired to monitored by verification.

1) read_n and write_n do not become Low at the same time
2) at the fall (negative) of write_n, enable_n is High
3) at the fall of read_n, enable_n is Low The PSL description (assertion description) to be given to a simulator as an assertion for the intention is as follows.

// psl property memcont1=never (!write_n && !read_n) @(posedge clk);
// psl assert memcont1;
// psl property memcont2=always (enable_n) @(negedge write_n);
// psl assert memcont2;
// psl property memcont3=always (!enable_n) @(negedge read_n);
// psl assert memcont3;

All of "psl, property, never, assert, always" in the above PSL description (assertion description) are reserved words in the PSL. All rows start with "//" which shows a comment of the Verilog-HDL. In this, instead of using "//", all of the PSL descriptions can be closed with "/**/".

The words "memcont1,2,3, !write_n && !read_n, posedge clk, enable_n, negedge write_n, !enable_n, negedge read_n" are descriptions by a user definition, and actual installed data names, that is, memory control signal names which appear in the RTL for defining the intention of 1) through 3) except for "memcont1,2,3".

In addition, "memcont1 though 3" are assertion names and are used for knowing an error log and a function coverage being given from the simulator as feedback.

The assertion description by the PSL has the following structural elements.

// psl property <an assertion name>=
    <an event to be monitored> -> <expected operation when a condition is satisfied> @<a strobe condition>;
// psl assert <an assertion name>;

For example, in the assertion description of 1), "memcont1" is an assertion name, "!write_n && !read_n" is an event to be monitored, in this case, "never" is added in front of the event; therefore, it is monitored that the condition (event) in ( ) never becomes true. If "always" is added, it is monitored that the condition in ( ) is true. In addition, by "@(posedge clk)" which follows the above statement, it is defined that monitoring the condition is executed at every time of rising edges (positive edges). "->" changes to "|=>" or "|->" depending on the time when the expected operation is started. In this, the above example does not accompany expected operations.

The part in ( ) except the strobe condition is described by the Verilog-HDL which returns Boolean values. The part in ( ) of the strobe condition has a description form of a sensitivity list described by an "always sentence" of the Verilog-HDL.

In the PSL, an event to be monitored can be defined, and each part of expected operations at the time when the condition is satisfied can define a sequence, that is, the changes of events and expected operations in plural cycles can be defined. An example is explained.

The intention of designing: When a clear start condition (m_task==2' 00) is satisfied in a clearing process of a memory, in order to initialize all words (256 words), a writing operation is repeated 256 times. Here, one writing operation is completed by the operation of Low→High→High of write_n synchronized with a rise cycle (positive cycle) of clk.

The PSL description:
// psl sequence WRITE_PULSE={!write_n; write_n; write_n};
// psl property CLEAR_MEM_WRITE_N=
// always {m_task==2' b00} |=> {WRITE_PULSE [*256]}
// @(posedge clk);
// psl assert CLEAR_MEM_WRITE_N;

"sequence" defines a Low→High→High sequence of "write_n" by a macro-definition.

Here, it is the part of expected operations which follows "|=>" that is to be focused on. When "m_task==2' boo", the expected operation is WRITE_PULSE, that is, it is expected that the sequence of Low→High→High being three cycles of write_n be repeated by 256 times.

However, in such an assertion verifying technology, for example, in a case where the assertion description language is written by a manual input when the specifications are defined, there is a possibility that a mistake may be made in the assertion itself. As a result, a report of the warning of the assertion violation and the function coverage obtained by the assertion verification cannot be fed back to prevent the system revision and the revised edition of the system. Further, this requires a verification period for debugging the assertion description language. Consequently, the verification efficiency becomes worse.

In other words, the major premise of the assertion verifying technology is that the circuit specifications and the assertion description match each other; however, there is no method to confirm the matching before executing the simulation. Further, with respect to a complex finite state machine, it is difficult to describe a sequence of a comprehensive state transition by manual operation.

As conventional technologies with respect to the assertion verification, for example, there are technologies disclosed in Patent Document 1 and Patent Document 2.

In Patent Document 1, a technology, in which a state transition machine is modeled by a graph and a state transition path that satisfies the assertion is searched, is disclosed. Further, a technology to confirm the rightness of the assertion by only an analysis of this graph is disclosed. By the technologies, matching the circuit specifications with the assertion description can be confirmed.

However, in these technologies, with respect to the state transition machine which is made to be a graph, a model of the state transition machine which becomes a basic model is formed manually, or the state transition machine is extracted from design data formed by a description language of a RTL. Consequently, mixing a mistake in an object to be matched, that is, in the model of the state transition machine which should be the circuit specifications, cannot be avoided.

In addition, in Patent Document 2, a technology, which generates an assertion for verifying a circuit by extracting a data transfer structure from design data of a RTL and expanding the data transfer structure into a graphic structure, is disclosed. However, in this technology, since the assertion which is the circuit specifications is extracted from the design data, matching the circuit specifications with the assertion description cannot be assured.

[Patent Document 1] Japanese Laid-Open Patent Application No. 2000-181933

[Patent Document 2] Japanese Laid-Open Patent Application No. 2000-142918

[Non-Patent Document 1] Property Specification Language Reference Manual Version 1.1 Jun. 9, 2004, online, retrieved in Sep. 14, 2004, from the Internet, URL: http://www.eda.org/vfv/docs/PSL-v1.1.pdf Consequently, in the conventional technologies, matching the circuit specifications with the assertion description cannot be assured.

DISCLOSURE OF THE INVENTION

The object of the present invention is to solve the problems in the conventional technologies, for example, to enable high reliability and high efficiency in assertion verification for an LSI and so on.

In order to achieve the above object, according to the present invention, a property to be verified is automatically converted into an assertion description language, based on a visual state transition figure, a timing chart, and a process sequence chart used when a designer forms specifications of a circuit.

According to one aspect of the present invention, there is provided an assertion generating system that generates an assertion description which is used for assertion verification of a semiconductor integrated circuit. The assertion generating system includes a specification inputting unit that generates design data or specifications and a document for confirming a specification of the semiconductor integrated circuit by graphically editing the specification of the semiconductor integrated circuit based on user operations; a first storing unit that stores the design data generated by the specification inputting unit; a property generating unit that generates a property which verifies the specification of the semiconductor integrated circuit by reading the design data generated by the specification inputting unit from the first storing unit and using the read design data; a second storing unit that stores the property generated by the property generating unit; and an assertion generating unit that converts the property into an assertion description by reading the property generated by the property generating unit from the second storing unit. In addition, the property generated by the property generating unit is a selection condition with respect to a state transition, a logic value of at least one or more signals, or at least one or more signals in the design data.

According to another aspect of the present invention, there is provided a program that makes a computer function as the units of the assertion generating system.

According to another aspect of the present invention, there is provided a circuit verifying system. The circuit verifying system includes the assertion generating system and executes assertion verification of a semiconductor integrated circuit by using an assertion description generated by the assertion generating system.

According to another aspect of the present invention, there is provided an assertion generating method that generates an assertion description which is used for assertion verification of a semiconductor integrated circuit by a computer which has a program. The assertion generating method includes a specification inputting step that generates design data of the semiconductor integrated circuit by graphically editing a specification of the semiconductor integrated circuit based on user operations and inputs the design data in storage; a property generating step that reads the design data generated at the specification inputting step from the storage and generates a property which verifies the specification of the semiconductor integrated circuit using the read design data and inputs the property in the storage; and an assertion generating step that reads the property generated at the property generating step from the storage and converts the property into an assertion description. In addition, the property generated by the property generating step is a selection condition with respect to a state transition, a logic value of at least one or more signals, or at least one or more signals in the design data.

According to the present invention, since the assertion description of a property to be verified is automatically generated from electronic data of the state transition figure which is attached to the specifications, matching the circuit specification with the assertion is established. Therefore, work to be used for debugging the assertion can be reduced. In addition, since the generated assertion is a function coverage point generated by comprehensive search of paths of the state transition, after the verification, feedback that a path has not been tested can be obtained by a function coverage report; consequently, missing a test of a corner case can be prevented. In addition, since the assertion description of a property to be verified is automatically generated from electronic data of a selection condition of timing charts and signals which are attached to the specifications, or electronic data of figures or a table form in which a process sequence is noted or defined, matching the circuit specification with the assertion is established. Therefore, work to be used for debugging the assertion can be reduced. In many cases, the selection condition of timing charts and signals which are attached to the specifications or the process sequence is an important assertion to be surely tested at the time of verification; however, since the assertion generated in the embodiment is an important property, a designer who does not know the specifications and the circuit functions sufficiently can execute verification by using the property. As a result, the number of times of revising the system caused by missing verification can be reduced.

These and other objects, features, and advantages of the present invention will become more apparent from the following detailed description of preferred embodiments given with reference to the accompanying drawings.

BRIEF DESCRIPTION OF THE DRAWINGS

FIG. 11 is a diagram showing a structural example of a logic table of a full adder used in the assertion generating system according to the present invention;

FIG. 12 is a diagram showing a structural body example of one cell when the cell is expanded in a table in a memory;

FIG. 15 is a diagram showing a structural example of a process sequence in a table form used in the assertion generating system according to the present invention.

BEST MODE FOR CARRYING OUT THE INVENTION

Figure 1:
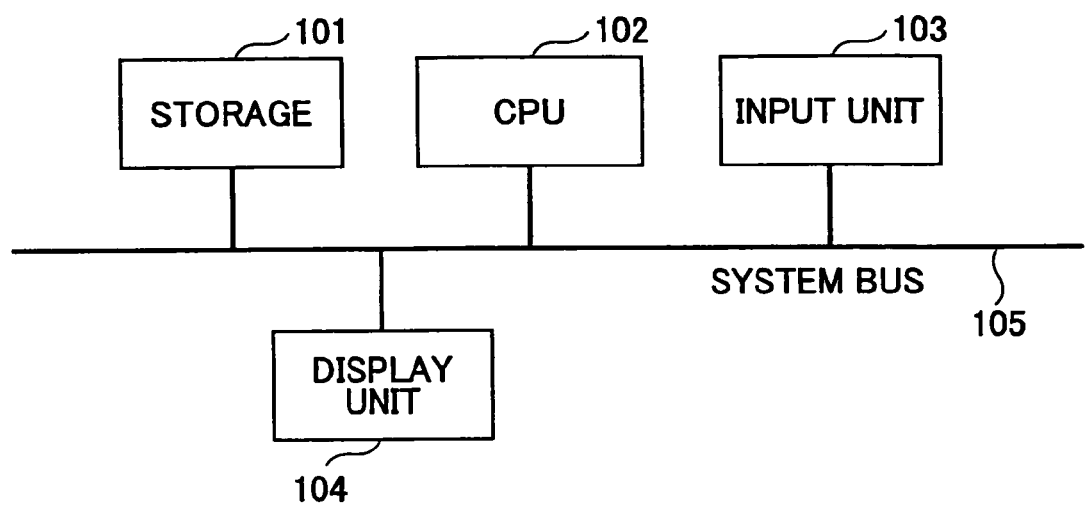
FIG. 1 is a block diagram showing a structural example of hardware of which an assertion generating system and a circuit verifying system according to the present invention consist.

Next, referring to the drawings, embodiments of the present invention are explained in detail.

Figure 2:
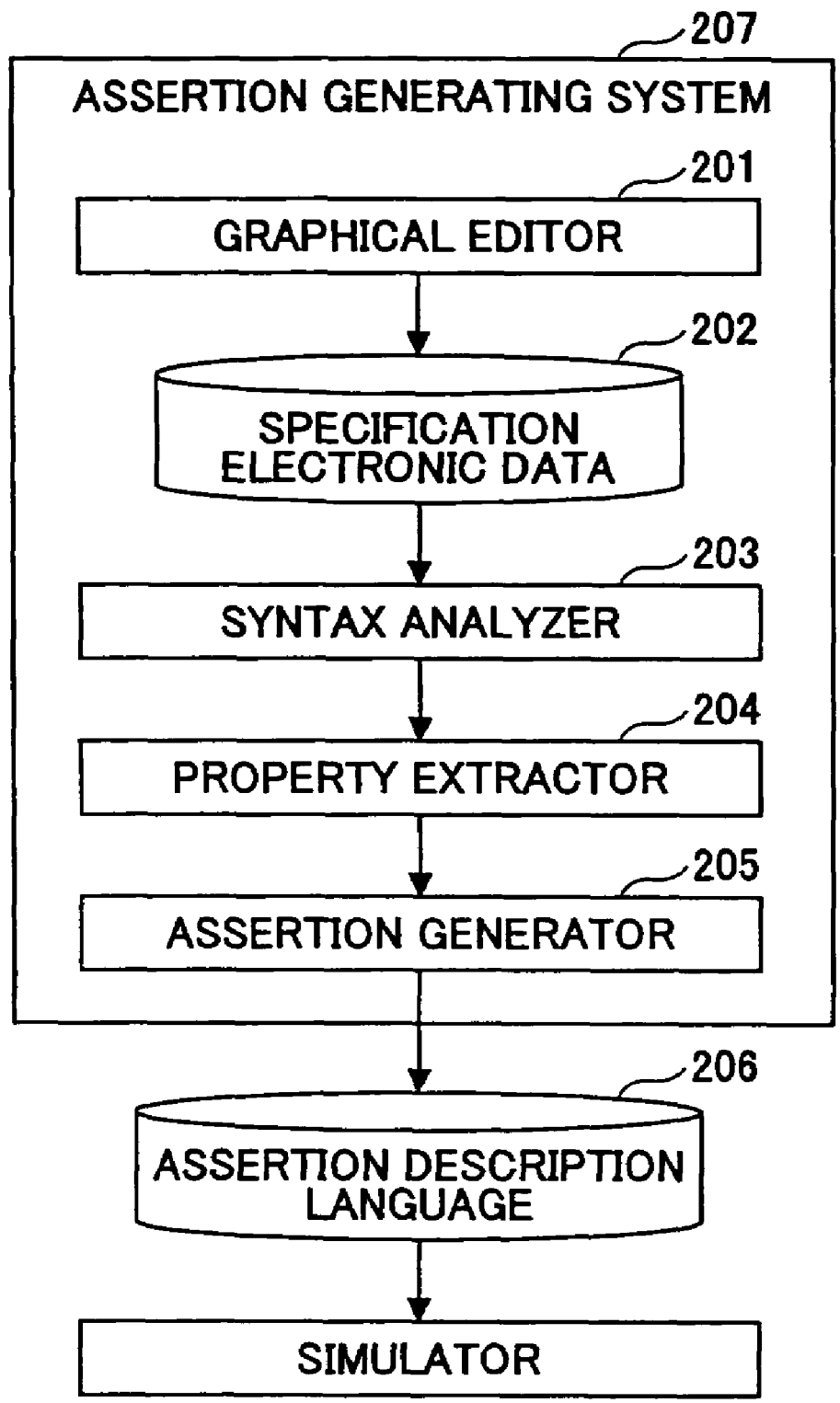
FIG. 2 is a block diagram showing a first functional structure example of the assertion generating system and the circuit verifying system using the assertion generating system according to the present invention.
Figure 3:
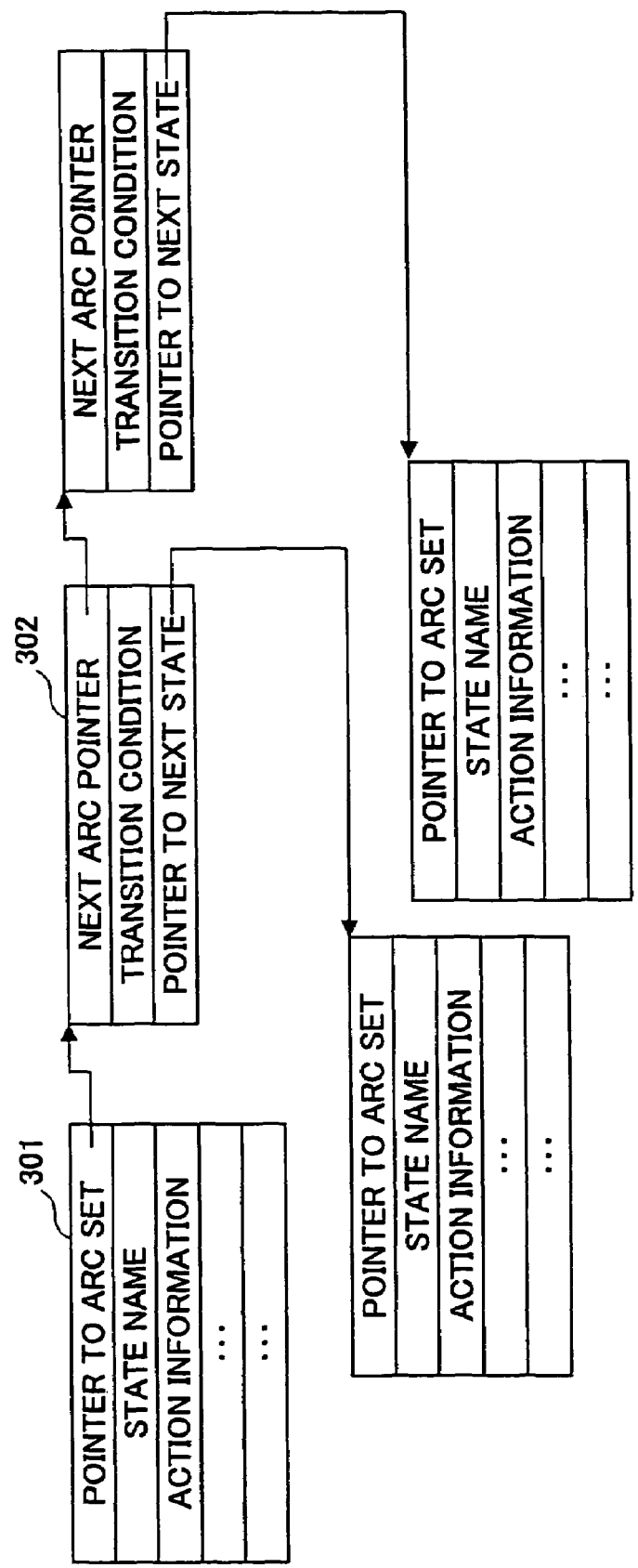
FIG. 3 is a diagram showing a memory content example of a graphic structure using in the assertion generating system according to the present invention.
Figure 4:
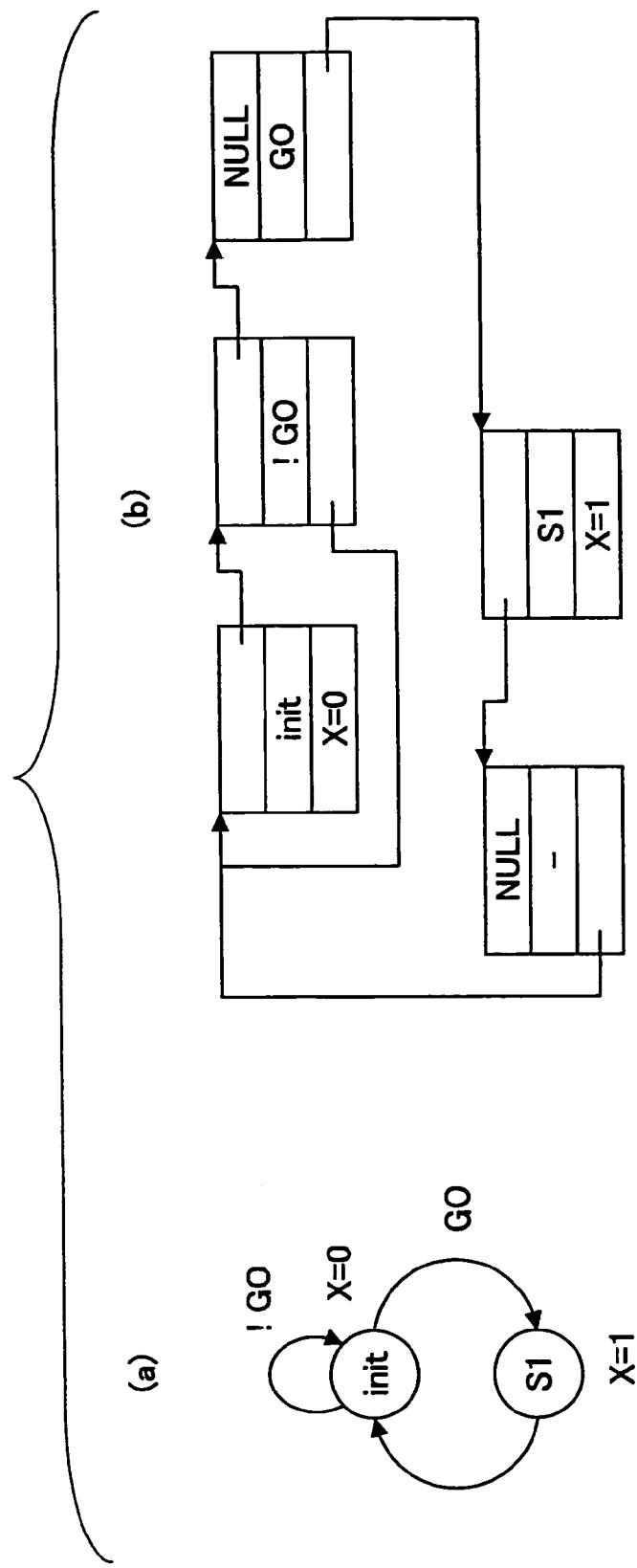
FIG. 4 is a diagram showing a state transition figure and a graphic structure using in the assertion generating system according to the present invention.
Figure 5:
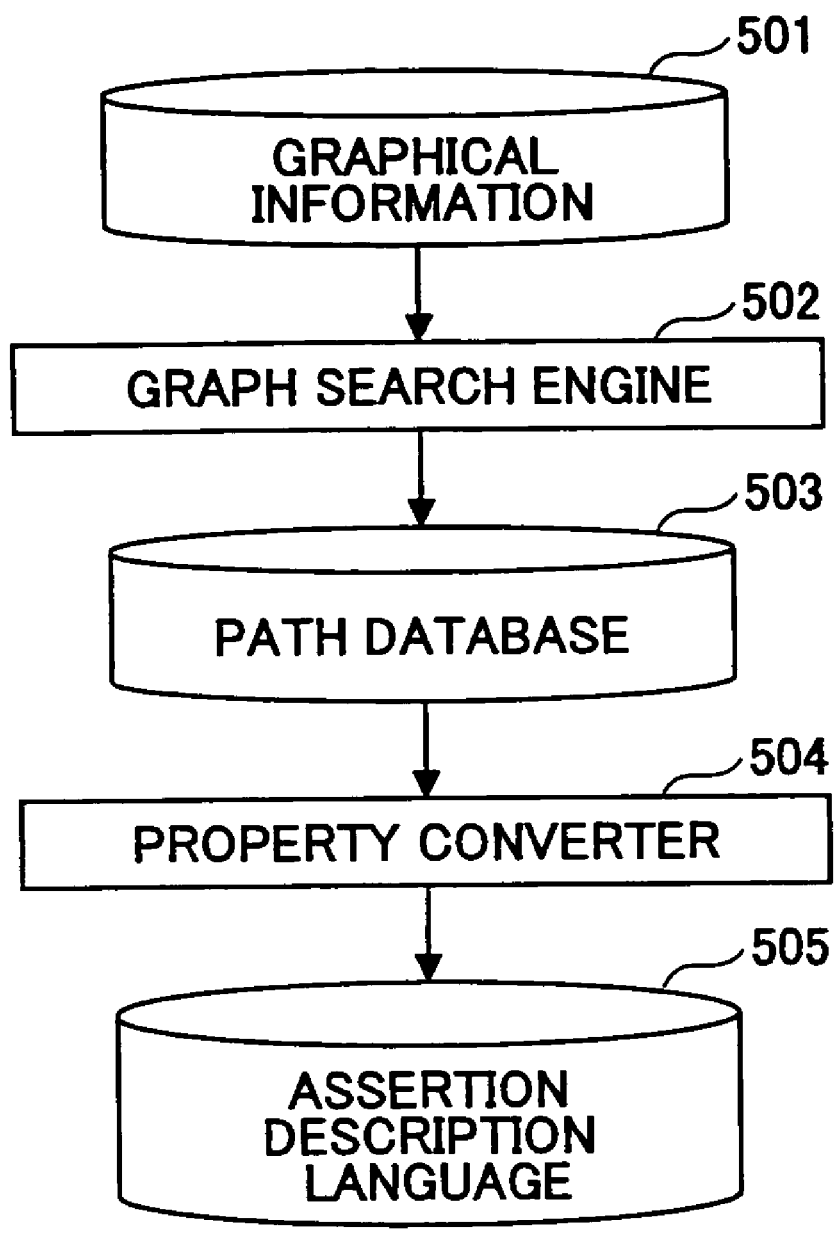
FIG. 5 is a block diagram showing a second functional structure example of the assertion generating system according to the present invention.
Figure 6:
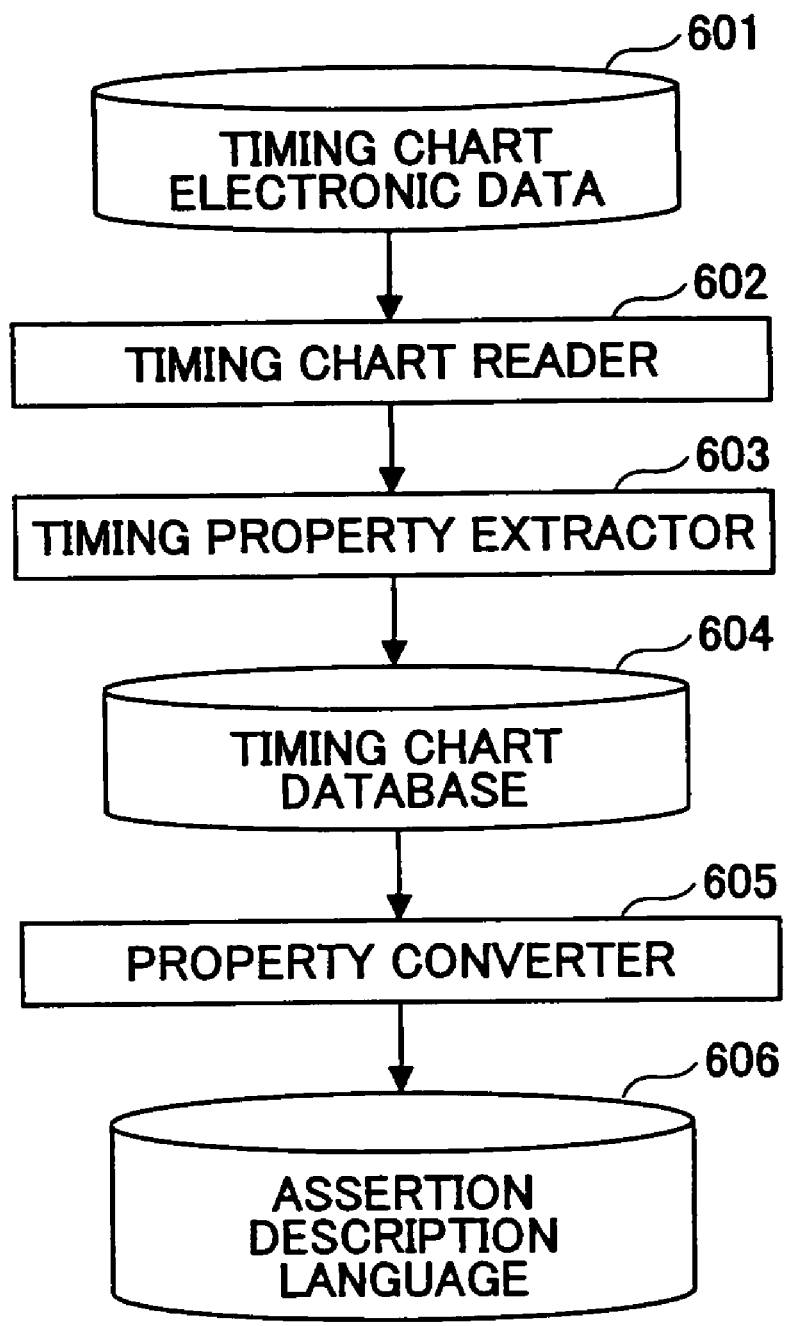
FIG. 6 is a block diagram showing a third functional structure example of the assertion generating system according to the present invention.
Figure 7:
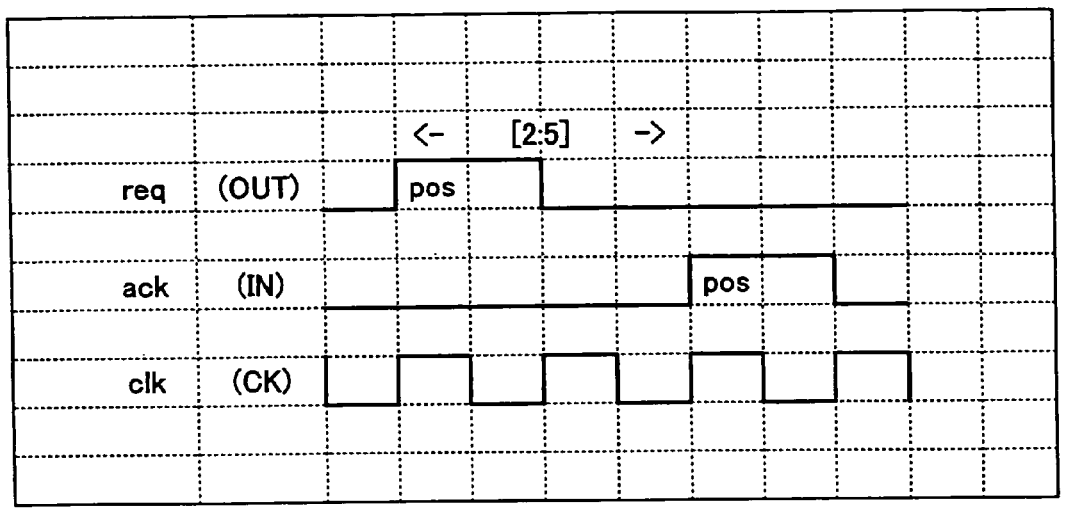
FIG. 7 is a diagram showing a timing chart example used in the assertion generating system according to the present invention.
Figure 8:
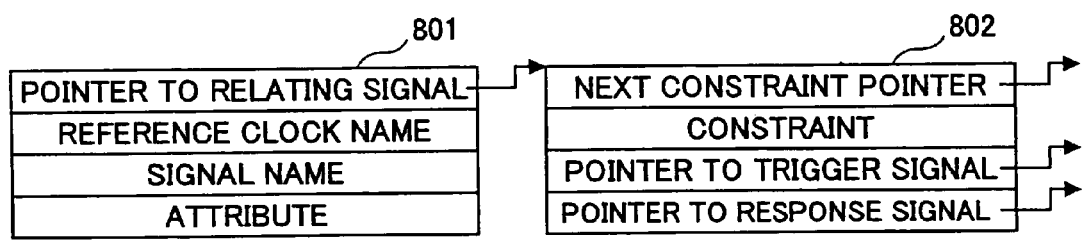
FIG. 8 is a diagram showing a structural body example for storing information with respect to signals defined on the timing chart and information with respect to timing constraints for the signals using in the assertion generating system according to the present invention.
Figure 9:
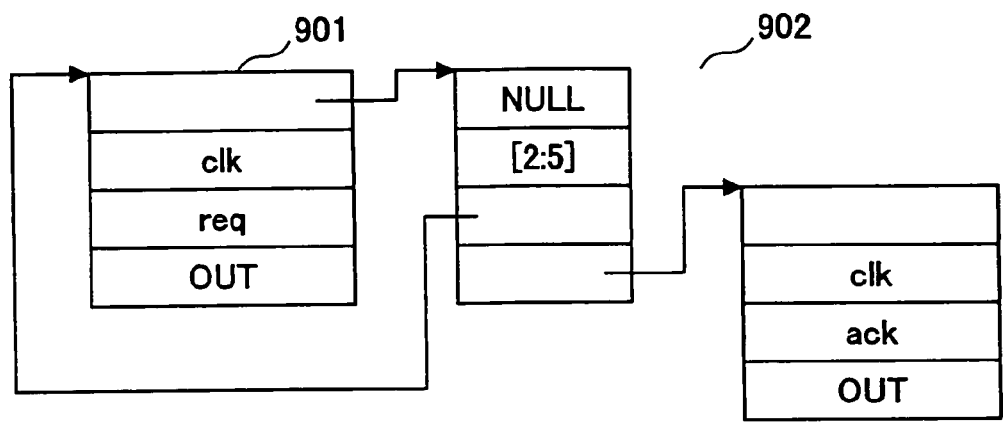
FIG. 9 is a diagram showing a memory content example of property information with respect to the timing chart shown in FIG. 7.
Figure 10:
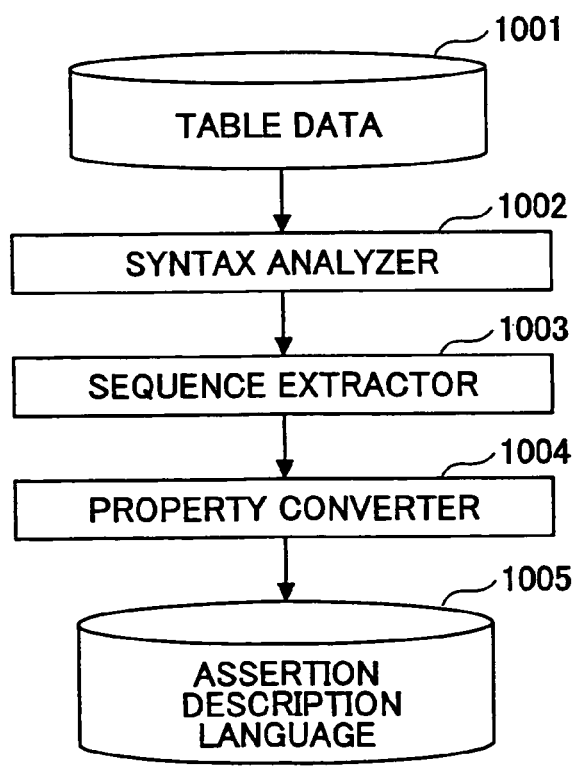
FIG. 10 is a block diagram showing a fourth functional structure example of the assertion generating system according to the present invention.
Figure 13:
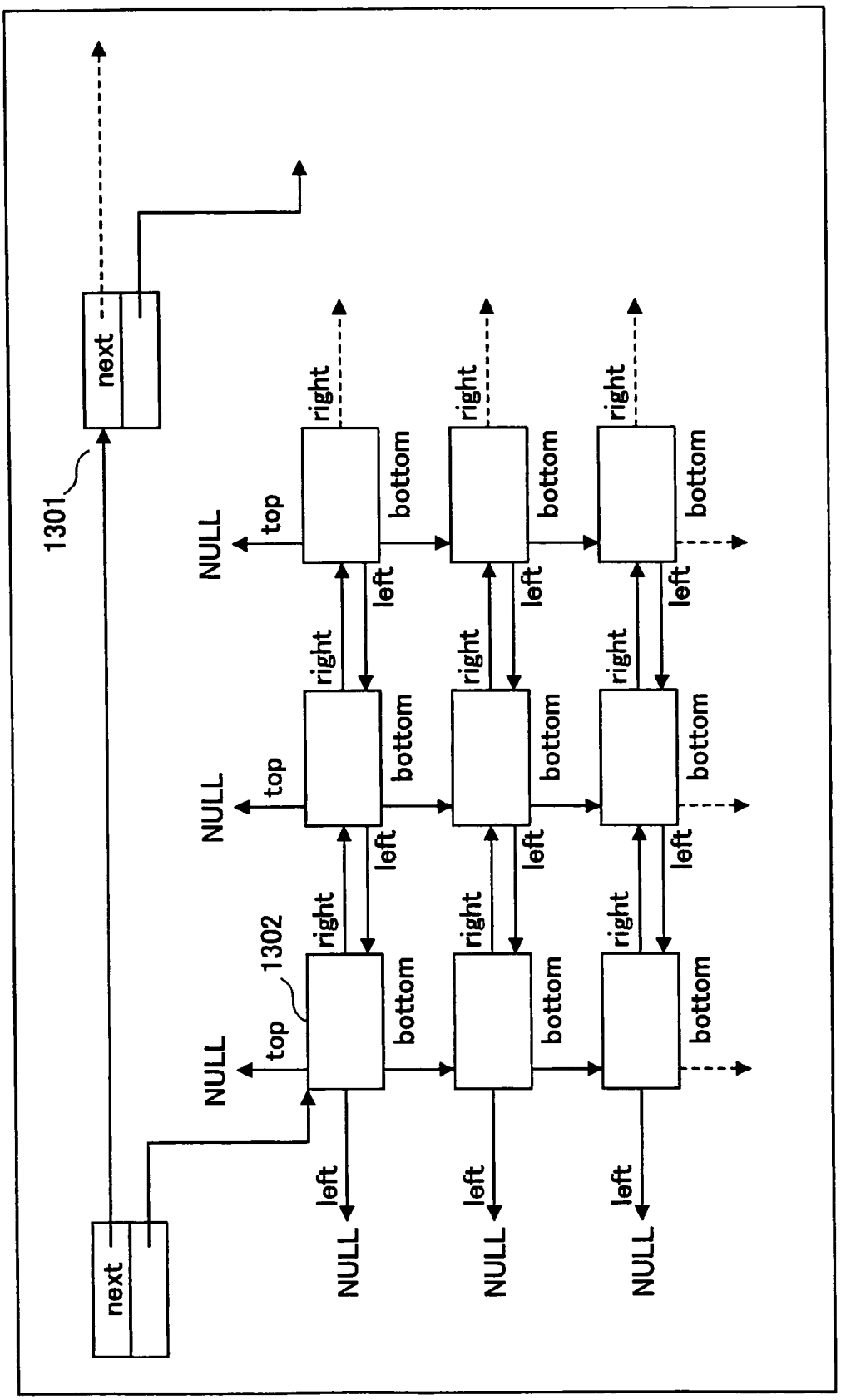
FIG. 13 is a diagram showing a memory structural example of a sheet in which cell structural bodies shown in FIG. 12 are combined.
Figure 14:
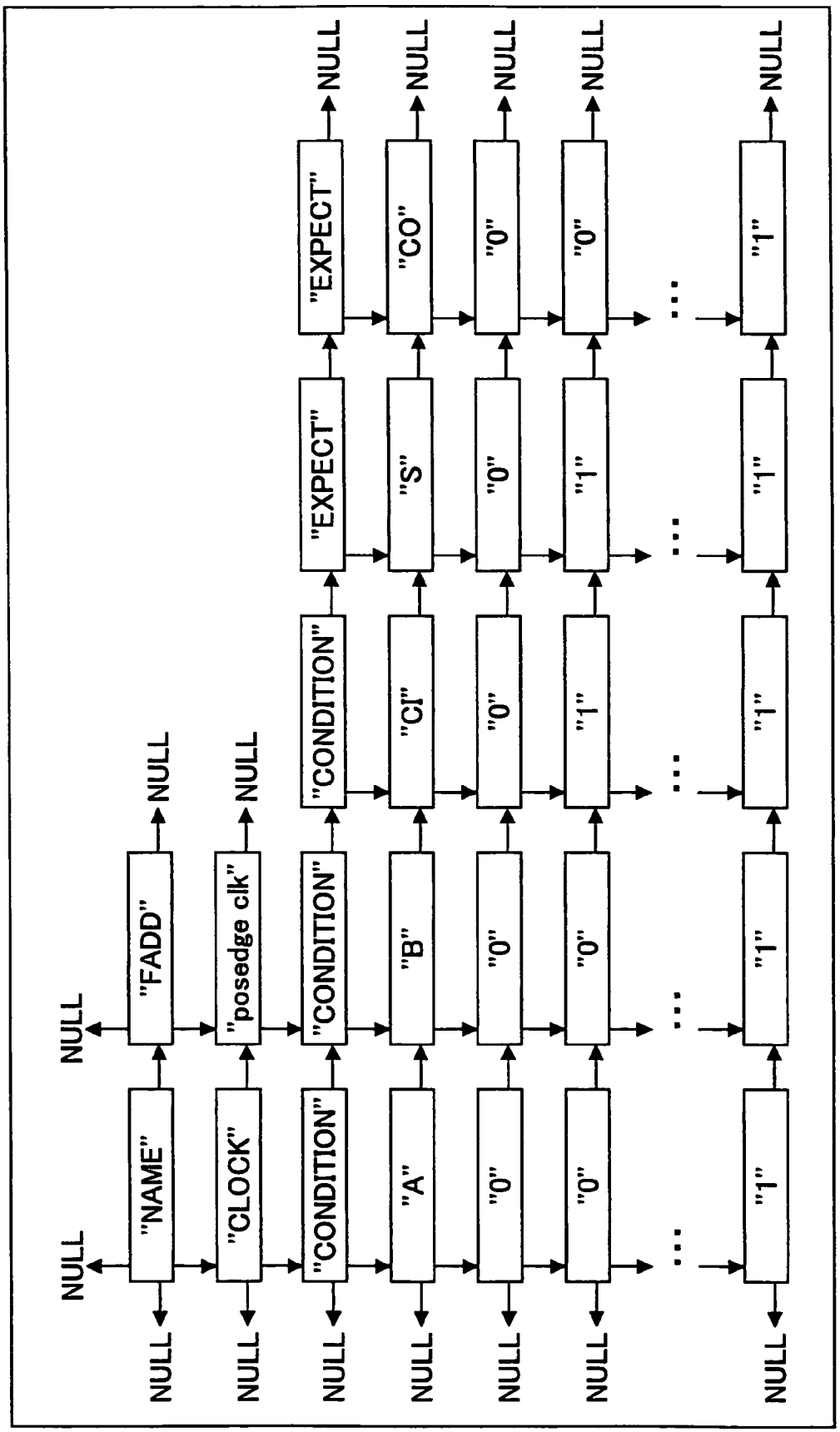
FIG. 14 is a diagram showing an example when the logic table of the full adder shown in FIG. 11 is expanded in the memory structural example shown in FIG. 13.

FIG. 1 is a block diagram showing a structural example of hardware of which an assertion generating system and a circuit verifying system according to the present invention consist. FIG. 2 is a block diagram showing a first functional structure example of the assertion generating system and the circuit verifying system using the assertion generating system according to the present invention. FIG. 3 is a diagram showing a memory content example of a graphic structure using in the assertion generating system according to the present invention. FIG. 4 is a diagram showing a state transition figure and a graphic structure using in the assertion generating system according to the present invention. FIG. 5 is a block diagram showing a second functional structure example of the assertion generating system according to the present invention. FIG. 6 is a block diagram showing a third functional structure example of the assertion generating system according to the present invention. FIG. 7 is a diagram showing a timing chart example used in the assertion generating system according to the present invention. FIG. 8 is a diagram showing a structural body example for storing information with respect to signals defined on the timing chart and information with respect to timing constraints for the signals using in the assertion generating system according to the present invention. FIG. 9 is a diagram showing a memory content example of property information with respect to the timing chart shown in FIG. 7. FIG. 10 is a block diagram showing a fourth functional structure example of the assertion generating system according to the present invention. FIG. 11 is a diagram showing a structural example of a logic table of a full adder used in the assertion generating system according to the present invention. FIG. 12 is a diagram showing a structural body example of one cell when the cell is expanded in a table in a memory. FIG. 13 is a diagram showing a memory structural example of a sheet in which cell structural bodies shown in FIG. 12 are combined. FIG. 14 is a diagram showing an example when the logic table of the full adder shown in FIG. 11 is expanded in the memory structural example shown in FIG. 13. FIG. 15 is a diagram showing a structural example of a process sequence in a table form used in the assertion generating system according to the present invention.

In FIG. 1, the reference number 101 is storage composed of a memory, a hard disk, and so on; the reference number 102 is a CPU (central processing unit); the reference number 103 is an input unit composed of a keyboard, a mouse, and so on; the reference number 104 is a display unit composed of a CRT (cathode ray tube), a LCD (liquid crystal display) and so on; the reference number 105 is a system bus, and a computer system is composed of the units 101 through 105 in which the units 101 through 104 are connected by the system bus 105.

The storage 101 stores functional descriptions of hardware not depending on architecture, and functions and means according to the present invention in feasible program formats which are read from recording media, from which a computer can read the programs, such as a CR-ROM (compact disc-read only memory), a DVD (digital video disc/digital versatile disc), and a FD (flexible disk). The CPU 102 executes the programs being stored in the storage 101, and executes processes of functions of the assertion generating system having the structure shown in FIG. 2.

A user interactively inputs commands to execute the programs that realize inputting and editing of the functional descriptions of hardware not depending on architecture and means of the present invention by using the input unit 103. The display unit 104 displays the functional descriptions of hardware not depending on architecture, and the progress and the results of the programs, which realize the means of the present invention, executed by the CPU 102.

FIG. 2 shows a basic structure of an assertion generating system 207 and a circuit verifying system using the assertion generating system 207 according to the present invention. First, a circuit specification to be specified in specifications is input from a graphical editor 201 by user operations, and the circuit specification input at the graphical editor 201 is stored in the storage 101 as specification electronic data 202. In this, as the graphical editor 201, a graphical editor such as a timing chart editor disclosed in, for example, Japanese Laid-Open Patent Application No. 1-309185 can be used.

Next, a syntax analyzer 203 reads the specification electronic data 202 being stored in the storage 101 and analyses the syntax, and a property extractor 204 extracts a property to be verified from the results of the syntax analysis.

An assertion generator 205 generates an assertion description language 206, which can be input to a simulator or a static property checker from the property extracted from the property extractor 204. The assertion description language 206 generated in such a manner is stored in the storage 101 and is input to a simulator, and verification is executed.

As mentioned above, according to the assertion generating system of this example, when assertion verification, which verifies design data in which a property with respect to a specification of a semiconductor integrated circuit or a part of the specification of the semiconductor integrated circuit is described in an assertion description with design data of a circuit to be verified of the property, is executed by a simulator or a static verification tool, the graphical editor 201 generates the specification electronic data 202 (design data) by editing a specification of a finite state machine by a visual expression on a state transition table or a state transition figure. The syntax analyzer 203 analyses the circuit specification defined at the graphical editor 201 and the property extractor 204 extracts a property to be verified based on the design data, and the assertion generator 205 outputs this property in an assertion description.

Here, the design data (specification electronic data) formed at the graphical editor 201 are expanded into a graphic structure on the storage 101, and the property extractor 204 can refer to the graphic structure. Further, as the design data (specification electronic data) formed at the graphical editor 201, data, in which a process sequence of a circuit is shown in a timing chart or a time series figure by using a business tool that can edit a table input or a figure, are included, in addition to the state transition table and the state transition figure.

FIG. 5 shows an example in which the state transition figure is used as the design data (specification electronic data) to be formed at the graphical editor 201. In FIG. 5, graphical information 501 that is the state transition figure exemplified in, for example, FIG. 4(a), is edited and formed by the graphical editor 201 and is stored in the storage 101 being a hard disk, a system memory, and so on.

The graphical information 501 includes visual information, that is, coordinate information and so on in which structural elements of the state transition figure are disposed, and the state transition figure expressed visually can be attached to specifications by printing out.

A graph search engine 502 has functions of the syntax analyzer 203 and the property extractor 204 shown in FIG. 2, and extracts a graphic structure exemplified in FIG. 4(b) from the state transition figure exemplified in FIG. 4(a), and temporarily stores the graphic structure in a system memory. In the extracted graphic structure, the structural elements of the state transition figure are formed as nodes, and the graph search engine 502 searches state transition paths. For example, the graph search engine 502 searches all state transition paths from an initial state of the state transition machine, extracts the paths, and stores them in the storage 101 as a path database 503.

A property converter 504 converts the state transition paths extracted by the graph search engine 502 into an assertion description language 505 by referring to the path database 503. The assertion description language 505 converted at the property converter 504 is described, for example, as a function coverage point for confirming whether the assertion description language 505 has been tested at a simulator.

An example of the memory content of the graphic structure to be used at the graph search engine 502 is shown in FIG. 3. In FIG. 3, the reference number 301 is a structural body that stores information of each state in the state transition figure, and the reference number 302 is a structural body that stores information of arcs in the state transition figure. These structural bodies 301 and 302 mutually execute a pointer reference and form a graph in which the respective pointers are made to be nodes.

In FIG. 4, FIG. 4(a) shows an example of a state transition figure, and FIG. 4(b) shows a graphic structure formed from the state transition figure. The graph search engine 502 shown in FIG. 5 searches the state transition paths from the state transition figure shown in FIG. 4(a) by using a path search in graph logic, for example, an algorithm of a shortest path search. As a result, the graphic structure shown in FIG. 4(b) is formed and the graphic structure is stored in the path database 503.

Next, an example of a state transition path to be stored in the path database 503 shown in FIG. 5 is shown by using the example shown in FIG. 4.

init;
(GO) S1;
init;

In this example, a path from "init" to "S1" is searched, and when "GO" is true, that is, is "1", the state transition path is formed.

In addition, an assertion description by PSL, which is generated by the property converter 504 in FIG. 5 (the assertion generator 205 in FIG. 2) from this state transition path, is shown as follows.

property init_to_S1=always {state==init & GO} |=> {state==S1};

In case of a state transition machine, it is necessary that all states are visited in verification, in order to quantify the verification accuracy of important functions being keys of circuit functions. Whether each state of the state transition machine is visited can be determined by confirming the function coverage of state verification by cover syntax of PSL. In case of the example shown in FIG. 4, it is enough that only state names stored in nodes of a graph are made to be a list by a cover description of PSL.

In the following, the result is shown. In this, "state" is a state register name for holding the state at the time when a state transition machine is installed.

// psl cover (state==init);
// psl cover (state==S1);

Here, in a case where the graphical information 501 shown in FIG. 5 has information of a graphic structure with the coordinate information, as shown in FIG. 3 and FIG. 4(a), the graph search engine 502 directly refers to the graphic structure in the graphical information 501.

Next, referring to FIG. 6, another embodiment of the present invention is explained. In the embodiment shown in FIG. 6, timing chart information to be attached to specifications is extracted from timing chart electronic data 601, and the interrelation with respect to timing of a signal group to be verified is made to be an assertion description.

In FIG. 6, the reference number 602 is a timing chart reader that reads the timing chart electronic data 601, the reference number 603 is a timing property extractor that extracts an interrelation with respect to timing of a signal group to be verified (timing chart information) and stores the interrelation in a timing chart database 604, and the reference number 605 is a property converter that reads the timing chart information from the timing chart database 604 and generates an assertion description language 606 that can be input to a simulator or a static property checker.

In this, the timing chart electronic data 601 can be data formed and edited by a timing chart editor (not shown), in this case, the timing chart reader 602 becomes a syntax analyzer for timing chart information formed and edited by the timing chart editor.

The memory content used by the timing property extractor 603 is shown in FIG. 8. In FIG. 8, the reference number 801 is a structural body that stores information with respect to signals defined on the timing chart, and the reference number 802 is a structural body that stores information with respect to timing constraint for the signals.

An example of the timing chart that is read by the timing chart reader 602 is shown in FIG. 7. In the example shown in FIG. 7, "ack" rises (becomes positive) during 2 to 5 cycles from the rise (positive) of "req" synchronized with "clk".

In the example shown in FIG. 7, the timing constraint (property), in which the positive of "ack" must be received in the range of 2 to 5 of "clk" after the output signal of "req" becomes 1, is described.

The timing property extractor 603 shown in FIG. 6 extracts the timing information (property) to be verified by using signal attributes such as IN, OUT, and CK, and "pos" that means a rising condition, and interrelation with respect to timing of a signal group such as "<-" and "->" as keywords.

The timing chart information shown in FIG. 7 formed and edited by the not-shown timing chart editor is stored in hardware by being edited in, for example, the following list. In the following list, 1 through 3 rows show pins and input/output attributes, for example, a clock input, and 4 through 7 rows show waveform information. In the sixth row, a property, in which "ack" rises (becomes positive) during 2 to 5 cycles from the rise (positive) of "req" synchronized with "clk", is shown.

1 CK clk;
2 IN ack;
3 OUT req;
4 {clk,req,ack}={1,0,0};
5 {clk,req,ack}={1,1,0};
6 {clk,req,ack}={1,0,0}[2:5];
7 {clk,req,ack}={1,0,1};

A memory content example of property information with respect timing expanded by this timing chart information is shown in FIG. 9.

Next, an example, in which a business tool capable of inputting a table and editing a figure is used for editing a logic table and a time series property of the above circuit, is explained.

FIG. 11 is a structural example in which a logic table of a full adder is input by Excel (a registered trademark) being spread sheet software of Microsoft Corp. NAME, CLOCK, CONDITION, and EXPECT shown in a bold type are reserved words when a table definition is executed, and show a property name, a clock name, a start condition of an assertion check, and expected operations when the assertion check is started, respectively.

In the next row of CONDITION and EXPECT, signal names are described, and under the names, logic values are entered. According to Excel, a sheet is composed of cells, a cell is a basic unit of a table, and the sheet can be output as an ASCII file by separating cells with ",".

In the case of FIG. 7, the signal name, the ½ pulse of clock, and so on are managed by cell, and after expanding in a memory, the cell structure is scanned and the memory content shown in FIG. 9 is obtained.

FIG. 12 is a structural body for expressing one cell when a cell of Excel is expanded in a memory. Members of top, bottom, left, and right in this structural body respectively execute a pointer reference to up and down and left and right.

FIG. 13 is a diagram showing a structural example of a sheet in which structural bodies of the cells shown in FIG. 12 are combined. The reference number 1301 is a pointer showing a sheet, and is composed of "next" being a pointer reference of the next sheet and a member that executes a pointer reference for a header of a cell. The reference number 1302 is a pointer of a cell, and executes a pointer reference for up and down and left and right by using the members of top, bottom, left, and right. By the above method, scanning cells on the sheet can be easily executed, and the retrieval by the keywords such as NAME, CLOCK, CONDITION, and EXPECT and the interpretation of the logic table can be executed.

FIG. 14 shows a content example when the logic table of the full adder shown in FIG. 11 is expanded in the memory structure shown in FIG. 13.

In the following, a PSL description, which generates an assertion description from the logic table of the full adder shown in FIG. 11, is shown. In this, the table and the verification data (that is, assertion) can be easily linked by adding the row number of the table to the structure of the assertion name. For example, on the first row, FADD_S__0_FADD_csv_line__5 is the assertion name, and line__5 corresponds to the row number of the table.

psl property FADD_S__0_FADD_csv_line__5=always {!A & !B & !CI} |-> {S===1' b0};
psl property FADD_CO__0_FADD_csv_line__5=always {!A & !B & !CI} |-> {CO===1' b0};
psl property FADD_S__1_FADD_csv_line__6=always {!A & !B & !CI} |-> {S===1' b1};
psl property FADD_CO__1_FADD_csv_line__6=always {!A & !B & !CI} |-> {CO===1' b0};
psl property FADD_S__2_FADD_csv_line__7=always {!A & !B & !CI} |-> {S===1' b1};
psl property FADD_CO__2_FADD_csv_line__7=always {!A & !B & !CI} |-> {CO===1'b0};
psl property FADD_S__3_FADD_csv_line__8=always {!A & !B & !CI} |-> {S===1' b0};
psl property FADD_CO__3_FADD_csv_line__8=always {!A & !B & !CI} |-> {CO===1' b1};
psl property FADD_S__4_FADD_csv_line__9=always {!A & !B & !CI} |-> {S===1' b1};
psl property FADD_CO__4_FADD_csv_line__9=always {!A & !B & !CI} |-> {CO===1' b0};
psl property FADD_S__5_FADD_csv_line__10=always {!A & !B & !CI} |-> {S===1' b0};
psl property FADD_CO__5_FADD_csv_line__10=always {!A & !B & !CI} |-> {CO===1' b1};
psl property FADD_S__6_FADD_csv_line__11=always {!A & !B & !CI} |-> {S===1' b0};
psl property FADD_CO__6_FADD_csv_line__11=always {!A & !B & !CI} |-> {CO===1' b1};
psl property FADD_S__7_FADD_csv_line__12=always {!A & !B & !CI} |-> {S===1' b1};
psl property FADD_CO__7_FADD_csv_line12=always {!A & !B & !CI} |-> {CO===1' b1};

In FIG. 10, another embodiment of the present invention is explained. In this embodiment, a sequence to be attached to specifications is stored as table data 1001, a syntax analyzer 1002 expands a sequence which is defined in a table form on a system memory, a sequence extractor 1003 extracts a process sequence to be verified, and a property converter 1004 converts the sequence into an assertion description 1005.

An example of a process sequence to be verified is shown in FIG. 15. This example shows a property equal to that shown in FIG. 7. This example is also formed by Excel. The syntax analyzer 1002 and the sequence extractor 1003 resolves a sequence described in cells into time series, and the property converter 1004 generates an assertion description by using a SERE expanded regular expression of PSL.

In the resolution of the sequence into time series, ";" in a character string is interpreted as behavior during one clock cycle. In FIG. 15, "0[*2:5]" uses a repetition expression of PSL, and means that a LOW period continues during 2 to 5 cycles. Further, since "0[*2:5];1;0" is described, "ack" shows behavior that a Low period continues during 2 to 5 cycles and after this High and Low follow.

In the following, an assertion description of PSL generated based on FIG. 15 is shown.

psl property reqack_ack__0_REQ_csv_line__5=always {(rose)} |-> {{ack===1' b0}[*2:5];{ack===1' b1}; {ack===1'b0};

Programs for which the CPU 102 shown in FIG. 1 executes process flows shown in FIGS. 5, 6, and 10 are recorded in a magnetic medium and so on in a feasible form and stored in the storage 101.

As explained by using FIGS. 1 through 15, the assertion generating system 207 according to the embodiment generates an assertion description that is used for assertion verification of a semiconductor integrated circuit. The graphical editor 201 (specification inputting unit) generates design data of the semiconductor integrated circuit by graphically editing a specification (finite state machine, process sequence) of the semiconductor integrated circuit into a state transition table and a state transition figure or a timing chart and a time series figure based on user operations, forms the specification electronic data 202 by expanding the design data to a graphic structure, and causes the storage 101 to store the data. In addition, the syntax analyzer 203 and the property extractor 204 (property generating unit) read the specification electronic data 202 (design data) from the storage 101 and generate a property that verifies the specification of the semiconductor integrated circuit based on the design data. Further, the assertion generator 205 (assertion generating unit) converts the property into the assertion description language 206.

In this, in the graphical editor 201 (specification inputting unit), the design data of the semiconductor integrated circuit can be generated by editing the specification of the semiconductor integrated circuit with the use of a logic table or a state table based on user operations. The assertion generator 205 converts the property into an assertion description; in which an assertion name composed of a table name or a table row number of the logic table or the state table edited at the graphical editor 201 (specification inputting unit), or an assertion name composed of a signal name or a state name in the logic table or the state table is added.

The circuit verification system according to the embodiment provides the assertion generating system 207 and executes assertion verification of the semiconductor integrated circuit by using the assertion description generated by the assertion generating system 207.

As mentioned above, according to the embodiments, since the assertion description of a property to be verified is automatically generated from electronic data of the state transition figure which is attached to the specifications, matching the circuit specification with the assertion is established. Therefore, work to be used for debugging the assertion can be reduced. In addition, since the generated assertion is a function coverage point generated by comprehensive search of paths of the state transition, after the verification, feedback that a path has not been tested can be obtained by a function coverage report; consequently, missing a test of a corner case can be prevented.

In addition, since the assertion description of a property to be verified is automatically generated from electronic data of a selection condition of timing charts and signals which are attached to the specifications, or electronic data of figures or a table form in which a process sequence is noted or defined, matching the circuit specification with the assertion is established. Therefore, work to be used for debugging the assertion can be reduced. In many cases, the selection condition of timing charts and signals which are attached to the specifications or the process sequence is an important assertion to be surely tested at the time of verification; however, since the assertion generated in the embodiment is an important property, a designer who does not know the specifications and the circuit functions sufficiently can execute verification by using the property; as a result, the number of times of revising the system caused by missing the verification can be reduced.

While the present invention is described above with reference to specific embodiments shown in FIGS. 1 through 15, it should be apparent that the invention is not limited to these embodiments, but numerous modifications could be made thereto by those skilled in the art without departing from the basic concept and scope of the invention. For example, in the embodiments, programs which realize the property extractor 204, the assertion generator 205, and so on are stored in the storage 101 by using recording media such as a CD-ROM, a DVD, and a FD; however, the programs can be stored in the storage 101 by down loading via a network using a communication apparatus.

Further, in the embodiments, the assertion description is executed by using PSL, but can be executed by using other languages.

This patent application is based on Japanese Priority Patent Application No. 2004-286042 filed on Sep. 30, 2004.

The invention claimed is:

1. An assertion generating system that generates an assertion description which is used for assertion verification of a semiconductor integrated circuit, comprising:
   a specification inputting unit that generates design data or specifications and a document for confirming a specification of the semiconductor integrated circuit by graphically editing the specification of the semiconductor integrated circuit based on user operations;
   a computer readable storage device having a first storing unit that stores the design data generated by the specification inputting unit;
   a property generating unit that generates a property which verifies the specification of the semiconductor integrated circuit by reading the design data generated by the specification inputting unit from the first storing unit and using the read design data;
   a second storing unit that stores the property generated by the property generating unit, wherein the second storing unit may or may not be a part of the computer readable storage device; and
   an assertion generating unit that automatically converts the property into an assertion description if the property is to be verified during assertion verification by reading the property generated by the property generating unit from the second storing unit, wherein
   the property generated by the property generating unit is a selection condition with respect to a state transition, a logic value of at least one or more signals, or at least one or more signals in the design data.

2. The assertion generating system as claimed in claim 1, wherein
   the property generating unit generates at least one or more properties, and
   the specification inputting unit includes a design data generating unit that generates the design data of the semiconductor integrated circuit by editing the specification of the semiconductor integrated circuit with the use of a state transition table or a state transition figure based on user operations.

3. The assertion generating system as claimed in claim 1, wherein the specification inputting unit includes a design data generating unit that generates the design data of the semiconductor integrated circuit by editing a process sequence of the semiconductor integrated circuit into a timing chart or a time series figure based on user operations, and the property is a sequence property.

4. The assertion generating system as claimed in claim 1, wherein the specification inputting unit includes a design data generating unit that generates the design data of the semiconductor integrated circuit by editing the specification of the semiconductor integrated circuit with the use of a logic table or a state table based on user operations, and the property is a temporal property.

5. The assertion generating system as claimed in claim 4, wherein the assertion generating unit converts the property into an assertion description in which an assertion name composed of a table name or a table row number of the logic table or the state table, or a signal name or a state name in the logic table or the state table edited by the specification inputting unit is added, and the property is the temporal property.

6. The assertion generating system as claimed in claim 1, wherein the specification inputting unit is a business tool of spread sheet software and expands the design data into a graphic structure and inputs the graphic structure in the first storing unit.

7. A circuit verifying system, comprising:
   an assertion generating system that generates an assertion description which is used for assertion verification of a semiconductor integrated circuit, comprising:
   a specification inputting unit that generates design data or specifications and a document for confirming a specification of the semiconductor integrated circuit by graphically editing the specification of the semiconductor integrated circuit based on user operations;
   a computer readable storage device having a first storing unit that stores the design data generated by the specification inputting unit;
   a property generating unit that generates a property which verifies the specification of the semiconductor integrated circuit by reading the design data generated by the specification inputting unit from the first storing unit and using the read design data;
   a second storing unit that stores the property generated by the property generating unit, wherein the second storing unit may or may not be a part of the computer readable storage device; and
   an assertion generating unit that automatically converts the property into an assertion description if the property is to be verified during assertion verification by reading the property generated by the property generating unit from the second storing unit, wherein
   the property generated by the property generating unit is a selection condition with respect to a state transition, a logic value of at least one or more signals, or at least one or more signals in the design data; and
   wherein the circuit verifying system executes assertion verification of the semiconductor integrated circuit by using the assertion description generated by the assertion generating system.

8. A computer readable medium encoded with a program for causing a computer provided in an assertion generating system, that is capable of generating an assertion description for assertion verification of a semiconductor integrated circuit, to execute:
   a specification inputting step that generates design data of the semiconductor integrated circuit by graphically editing a specification of the semiconductor integrated circuit based on user operations and inputs the design data in storage;

a property generating step that reads the design data generated at the specification inputting step from the storage and generates a property which verifies the specification of the semiconductor integrated circuit using the read design data and inputs the property in the storage; and an assertion generating step that reads the property generated at the property generating step from the storage and automatically converts the property into an assertion description if the property is to be verified during assertion verification, wherein the property generated by the property generating step is a selection condition with respect to a state transition, a logic value of at least one or more signals, or at least one or more signals in the design data.

9. The computer readable medium as claimed in claim 8, wherein the property generating step generates at least one or more properties, and the specification inputting step generates the design data of the semiconductor integrated circuit by editing the specification of the semiconductor integrated circuit with the use of a state transition table or a state transition figure based on user operations.

10. The computer readable medium as claimed in claim 8, wherein the specification inputting step generates the design data of the semiconductor integrated circuit by editing a process sequence of the semiconductor integrated circuit into a timing chart or a time series figure based on user operations, and the property is a sequence property.

11. The computer readable medium as claimed in claim 8, wherein the specification inputting step generates the design data of the semiconductor integrated circuit by editing the specification of the semiconductor integrated circuit with the use of a logic table or a state table based on user operations, and the property is a temporal property.

12. The computer readable medium as claimed in claim 11, wherein the assertion generating step converts the property into an assertion description in which an assertion name composed of a table name or a table row number of the logic table or the state table, or a signal name or a state name in the logic table or the state table edited at the specification inputting step is added, and the property is the temporal property.

13. The computer readable medium as claimed in claim 8, wherein the specification inputting step expands the design data into a graphic structure and inputs the graphic structure in the storage.

14. A manufacturing method of a semiconductor device, comprising:

a designing step that designs an integrated circuit having a predetermined function;

a simulating step that simulates the integrated circuit by using an assertion generated by an assertion generating method; and a manufacturing step that manufactures a semiconductor device based on specifications of the integrated circuit, and wherein the assertion generating method comprises:

a specification inputting step that generates design data of the semiconductor integrated circuit by graphically editing a specification of the semiconductor integrated circuit based on user operations and inputs the design data in storage;

a property generating step that reads the design data generated at the specification inputting step from the storage and generates a property which verifies the specification of the semiconductor integrated circuit using the read design data and inputs the property in the storage; and an assertion generating step that reads the property generated at the property generating step from the storage and automatically converts the property into an assertion description if the property is to be verified during assertion verification, wherein the property generated by the property generating step is a selection condition with respect to a state transition, a logic value of at least one or more signals, or at least one or more signals in the design data.

\* \* \* \* \*

UNITED STATES PATENT AND TRADEMARK OFFICE
CERTIFICATE OF CORRECTION

PATENT NO.      : 7,603,636 B2
APPLICATION NO. : 10/579766
DATED           : October 13, 2009
INVENTOR(S)     : Takamitsu Yamada It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 513 days.

Signed and Sealed this

Fifth Day of October, 2010

David J. Kappos
*Director of the United States Patent and Trademark Office*